United States Patent
Perel et al.

(10) Patent No.: US 7,723,697 B2
(45) Date of Patent: May 25, 2010

(54) TECHNIQUES FOR OPTICAL ION BEAM METROLOGY

(75) Inventors: Alexander S. Perel, Danvers, MA (US);
Wilhelm Platow, Somerville, MA (US);
Craig Chaney, Rockport, MA (US);
Frank Sinclair, Quincy, MA (US);
Tyler Rockwell, Wakefield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 153 days.

(21) Appl. No.: 11/859,219

(22) Filed: Sep. 21, 2007

(65) Prior Publication Data

US 2009/0078883 A1    Mar. 26, 2009

(51) Int. Cl.
*G01K 11/00*    (2006.01)
*G21K 5/02*    (2006.01)
*G21K 5/10*    (2006.01)

(52) U.S. Cl. .................. 250/396 R; 250/492.1; 250/492.2; 250/492.21; 250/492.3

(58) Field of Classification Search ............. 250/396 R, 250/400, 423 R, 424, 491.1, 492.1, 492.2, 250/492.21, 492.22, 492.23, 492.3, 397, 250/398; 118/715, 716, 717, 720, 721, 723 R, 118/723 VE, 723 CB, 723 EB, 723 FE, 723 FI; 216/58, 66, 94; 427/566; 438/712, 949, 438/961

See application file for complete search history.

(56) References Cited

U.S. PATENT DOCUMENTS

| | | | |
|---|---|---|---|
| 6,040,912 A | 3/2000 | Zika et al. | |
| 6,566,661 B1 | 5/2003 | Mitchell | |
| 6,791,094 B1* | 9/2004 | Olson et al. | 250/397 |
| 6,911,550 B2 | 6/2005 | Abdel-Monem et al. | |
| 6,911,660 B2 | 6/2005 | Larsen | |
| 6,984,832 B2 | 1/2006 | Halling et al. | |
| 6,989,545 B1 | 1/2006 | Rathmell et al. | |
| 7,064,340 B1 | 6/2006 | Vanderberg et al. | |
| 7,423,277 B2* | 9/2008 | Perel et al. | 250/492.21 |
| 2003/0164459 A1* | 9/2003 | Schardt et al. | 250/492.3 |
| 2006/0192142 A1* | 8/2006 | Yamashita | 250/492.1 |
| 2006/0202130 A1* | 9/2006 | Kollmer et al. | 250/423 R |
| 2008/0061228 A1* | 3/2008 | Vanderberg et al. | 250/298 |
| 2008/0061250 A1 | 3/2008 | Perel et al. | |
| 2008/0132046 A1* | 6/2008 | Walther | 438/513 |

FOREIGN PATENT DOCUMENTS

JP    20030346700 A    5/2003

* cited by examiner

*Primary Examiner*—Jack I Berman
*Assistant Examiner*—Nicole Ippolito Rausch

(57) ABSTRACT

Techniques for providing optical ion beam metrology are disclosed. In one particular exemplary embodiment, the techniques may be realized as an apparatus for controlling beam density profile, the apparatus may include one or more camera systems to capture at least one image of an ion beam and a control system coupled to the one or more camera systems to control a beam density profile of the ion beam. The control system may further include a dose profiler to provide information to one or more ion implantation components in at least one of a feedback loop and a feedforward loop to improve dose and angle uniformity.

17 Claims, 9 Drawing Sheets

TECHNIQUES FOR OPTICAL ION BEAM METROLOGY

FIELD OF THE DISCLOSURE

The present disclosure relates generally to semiconductor manufacturing equipment and, more particularly, to techniques for optical ion beam metrology.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

In an ion implantation process, an ion beam typically scans a wafer or substrate surface. As used hereinafter, "scanning" a wafer or substrate surface with an ion beam refers to the relative movement of the ion beam with respect to the wafer or substrate surface.

An ion beam is typically either a "spot beam" having an approximately circular or elliptical cross section or a "ribbon beam" having a rectangular cross section. For purposes of the present disclosure, a "ribbon beam" may refer to either a static ribbon beam or a scanned ribbon beam. The latter type of ribbon beam may be created by scanning a spot beam back and forth at a high frequency.

In the case of a spot beam, scanning of a wafer may be achieved by sweeping the spot beam back and forth between two endpoints to form a beam path and by simultaneously moving the wafer perpendicular to the beam path. Alternatively, the spot beam may be kept stationary, and the wafer may be moved in a two-dimensional (2-D) pattern with respect to the spot beam. In the case of a ribbon beam, scanning of a wafer may be achieved by keeping the ribbon beam stationary and by simultaneously moving the wafer across the ribbon beam. If the ribbon beam is wider than the wafer, a one-dimensional (1-D) movement of the wafer may cause the ribbon beam to cover the entire wafer surface. The much simpler 1-D scanning makes a ribbon beam a preferred choice for single-wafer ion implantation production.

However, just like spot beams, ribbon beams can suffer from intrinsic non-uniformity problems. A ribbon beam typically consists of a plurality of beamlets, wherein each beamlet may be considered, conceptually, as one spot beam. Though beamlets within a ribbon beam travel in the same general direction, any two beamlets may not be pointing in exactly the same direction. In addition, each beamlet may have an intrinsic angle spread. As a result, during ion implantation with a ribbon beam, different locations on a target wafer may experience different ion incident angles. Furthermore, beamlets may not be evenly spaced within the ribbon beam. One portion of the ribbon beam where beamlets are densely distributed may deliver a higher ion dose than another portion of the ribbon beam where beamlets are sparsely distributed. Therefore, a ribbon beam may lack angle uniformity and/or dose uniformity.

FIG. 1 depicts a conventional ion implanter system 100. As is typical for most ion implanter systems. The ion implanter system 130 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards an end station 120.

An extraction electrode configuration, such as a ground electrode and a suppression electrode (not shown), may be positioned in front of the extraction manipulator 104. Each of the ground electrode and the suppression electrode have an aperture aligned with an aperture of the extraction manipulator 104 for extraction of a well-defined ion beam 10 from the ion source 102 for use in the ion implanter system 100.

The end station 120 supports one or more workpieces, such as workpiece 122, in the path of ion beam 10 such that ions of a desired species are implanted into the workpiece 122. The workpiece 122 may be, for example, a semiconductor wafer or other similar target object requiring ion implantation. The end station 120 may also include a platen 124 to support the workpiece 122. The platen 124 may secure the workpiece 122 using electrostatic or other forces. The end station 120 may also include a component (not illustrated) for moving the workpiece 122 in a desired direction. The end station 120 may also include additional components, such as automated workpiece handling elements for introducing the workpiece 122 into the ion implanter system 100 and for removing the workpiece 122 after ion implantation. It should be appreciated by those skilled in the art that the entire path traversed by the ion beam 10 is evacuated during ion implantation.

The ion implanter system 100 may also include a controller (not illustrated) to control a variety of subsystems and components of the ion implanter system 100. The ion implanter system 100 may also include a number of measurement devices, such as a dose control Faraday cup 118, a traveling Faraday cup 128, and a dose Faraday cup 126. These devices may be used to monitor and control ion beam conditions.

Although these additional components have been utilized in conventional ion implanters to improve either angle uniformity or dose uniformity of a ribbon beam, a more efficient solution has yet to be made available for providing ribbon beams that meet current dose and angle uniformity requirements for ion implantation production. For example, it is typically required that a ribbon beam should produce, in a wafer plane, a dose uniformity with less than 1% variations together with an angle uniformity with less than 0.50° variations. Such stringent uniformity requirements are becoming more difficult to meet since both types of uniformity may be elusive, especially in semiconductor manufacturing which require relatively high specificity and reliability.

In view of the foregoing, it may be understood that there are significant problems and shortcomings associated with current ion implantation technologies.

SUMMARY OF THE DISCLOSURE

Techniques for providing optical ion beam metrology are disclosed. In one particular exemplary embodiment, the techniques may be realized as a method and apparatus for controlling beam density profile. The apparatus may include one or more camera systems to capture at least one image of an ion beam and a control system coupled to the one or more camera systems to control a beam density profile of the ion beam.

In accordance with other aspects of this particular exemplary embodiment, the beam density profile may include ion beam uniformity, which may further include at least one of dose uniformity and angle uniformity.

In accordance with further aspects of this particular exemplary embodiment, the one or more camera systems may include one or more moveable mirrors.

In accordance with additional aspects of this particular exemplary embodiment, the one or more camera systems are positioned at various positions along an ion beam path.

In accordance with other aspects of this particular exemplary embodiment, the one or more camera systems may include at least one swivel camera.

In accordance with further aspects of this particular exemplary embodiment, the control system may further include a dose profiler to provide information to one or more ion implantation components in at least one of a feedback loop and a feedforward loop to control beam density profile.

In accordance with additional aspects of this particular exemplary embodiment, the one or more camera systems may include at least one color filter to enhance the image of the ion beam, wherein the enhanced image of the ion beam provides at least one of the following additional information about ions in the beam: type, density, and charge.

In accordance with other aspects of this particular exemplary embodiment, the apparatus may further include one or more gases to enhance the image of the ion beam.

In accordance with further aspects of this particular exemplary embodiment, the apparatus may further include at least one of a post and a mask that intersects the ion beam to create a shadow in the image of the ion beam for determining angle uniformity.

In accordance with another exemplary embodiment of the present disclosure, an apparatus may include one or more camera systems to capture at least one image of an ion beam and a control system coupled to the one or more camera systems to customize a profile of the ion beam.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide an ion implantation solution that improves measurement of ion beam profiles and ion beam angles using optical ion beam metrology.

Figure 1:
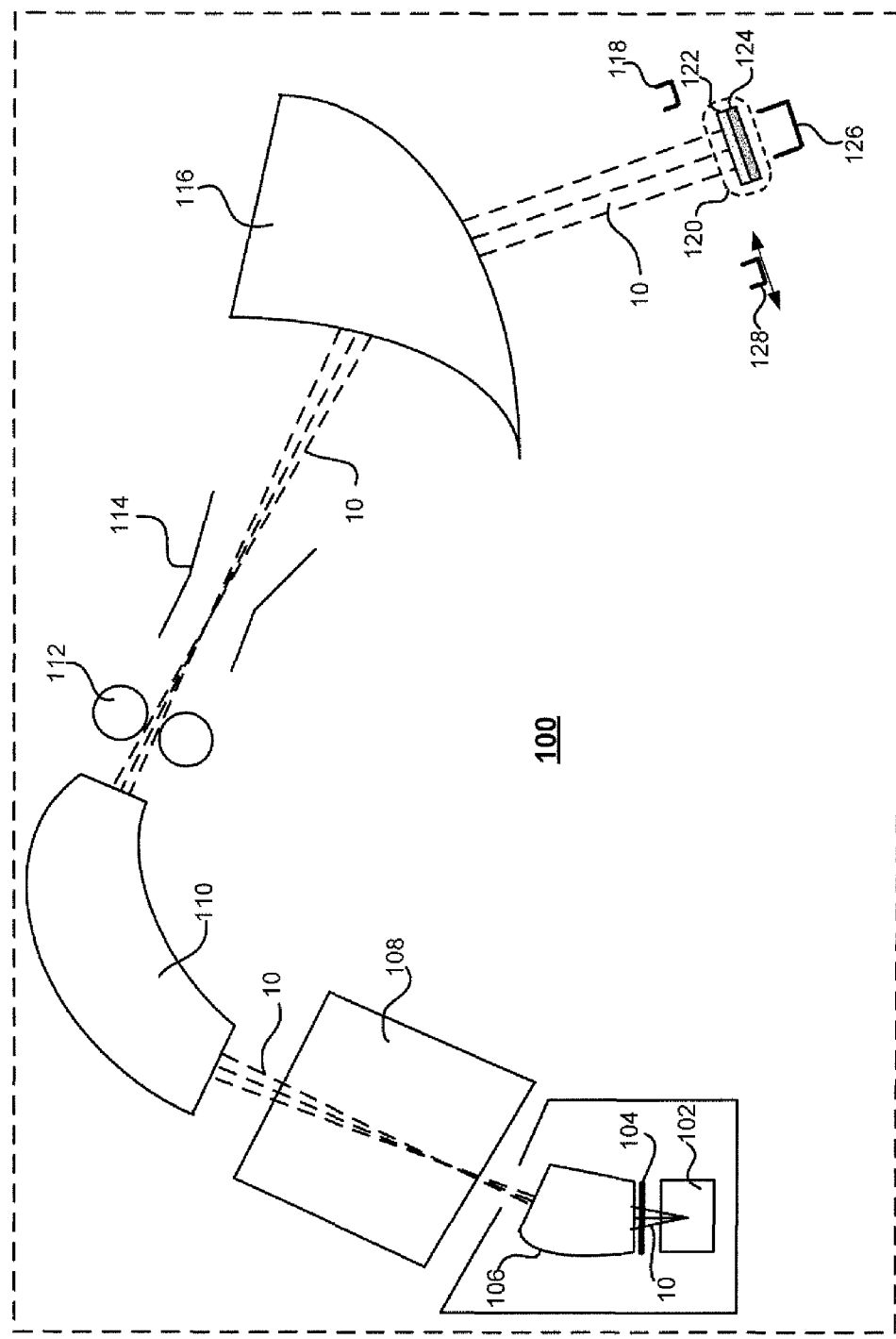
FIG. 1 depicts a conventional ion implanter system.
Figure 2A:
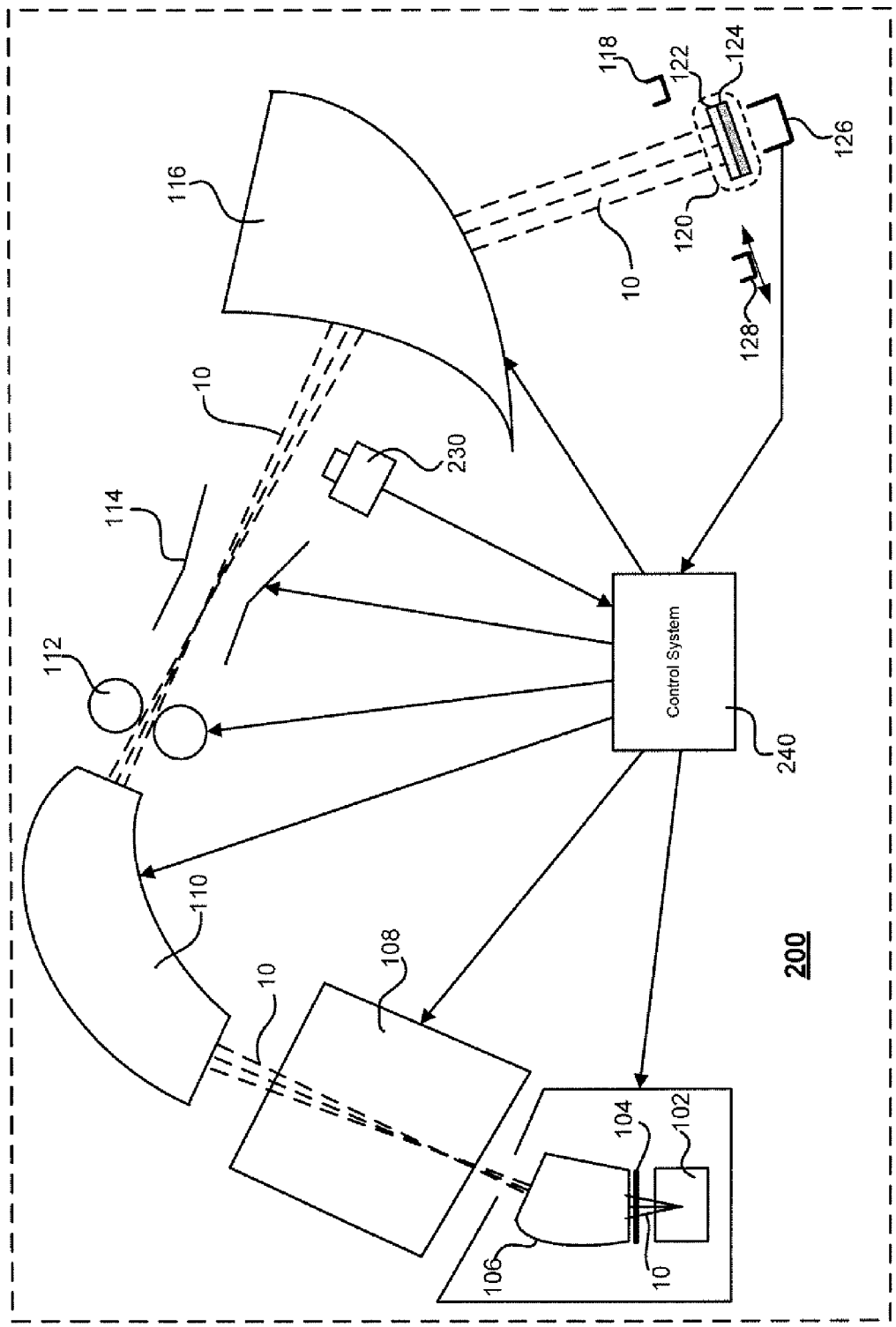
FIG. 2A-2B depict an exemplary ion implanter system configuration in accordance with an embodiment of the present disclosure.

Referring to FIG. 2A, there is shown an exemplary ion implanter system configuration 200 in accordance with an embodiment of the present disclosure. The ion implanter system 200 of FIG. 2A incorporates all of the elements of FIG. 1. In addition, the ion implanter system 200 may include a camera 230 and a control system 240. The camera 230 may be positioned adjacent to an ion beam 10 for taking one or more images of the ion beam 10. The ion beam 10 may be viewed through the camera 230 via at least one window on the chamber. In one embodiment, the one or more images of the ion beam 10 may be stored in the camera 230. In another embodiment, the one or more images of the ion beam 10 may be transmitted to the control system 240 for storage in one or more storage mediums (e.g., database) (not shown) at the control system 240. The control system 240 may include one or more processors (not shown) for analyzing the image of the ion beam 10 transmitted from the camera 230. In this example, the control system 240 may provide instructions to at least one of the several components of the ion implanter system 200 (e.g., the extraction manipulator 104, the filter magnet 106, an acceleration or deceleration column 108, the analyzer magnet 110, the rotating mass slit 112, the scanner 114, and the corrector magnet 116) to adjust ion dose and ion beam angle based on the information gathered from the image of the ion beam 10. It should be appreciated that an ion beam profile may be also be provided to the control system 240 by the dose Faraday cup 126, in conjunction with the image from the camera 230, to adjust ion dose and ion beam angle at the various components of the ion implanter system 200.

Figure 2B:
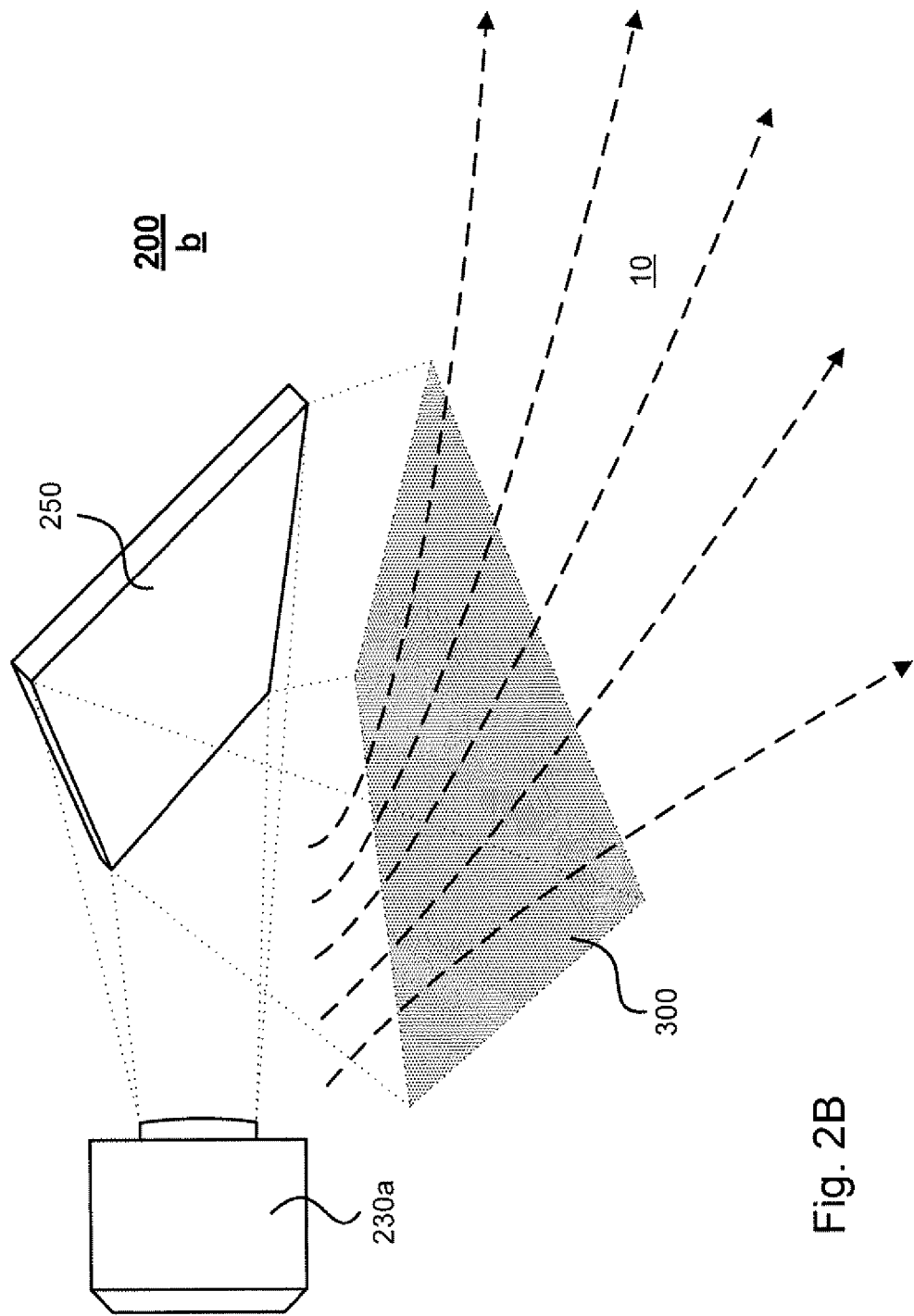

In one embodiment, as depicted in FIG. 2B, an ion implanter system 200b may include a camera 230a that is adjacent and positioned above a plane of an ion beam 10. For instance, the camera may be positioned approximately six (6) to eight (8) inches above the plane of the ion beam. Using a minor 250, which may be tilted at a predetermined angle (e.g., 45 degrees), the camera 230a may be able to capture an image of the ion beam 10 from a top view at an image area 300. In one embodiment, the minor 250 may be a movable mirror and may be formed of a various reflective materials, e.g., metallic or non-metallic.

It should be appreciated that while the image area 300 is depicted as a top view, one of ordinary skill in the art would recognize that the image area may be viewed from a variety of angles and/or positions (e.g., side view, bottom view, etc.) to best capture an image of the ion beam 10.

It should be appreciated that while a mirror 250 may be used for capturing an image of the ion beam 10 at the image area 300, one of ordinary skill in the art would recognize that several various embodiments may also be utilized. For example, in one embodiment, a mirror 250 may not be necessary. In this case, a camera 230a may be positioned directly above the image area 300 to capture the image of the ion beam 10. In another embodiment, two or more movable mirrors may be utilized. In this example, the two or more movable mirrors may optimize image capture in the event the camera 230a is fixed or too large to move to another position. Here, the two or more movable mirrors may be of various types, sizes, and shapes in order to facilitate image capture, particularly in areas where a camera 230a may not be conveniently situated within the ion implanter system 200.

Figure 3A:
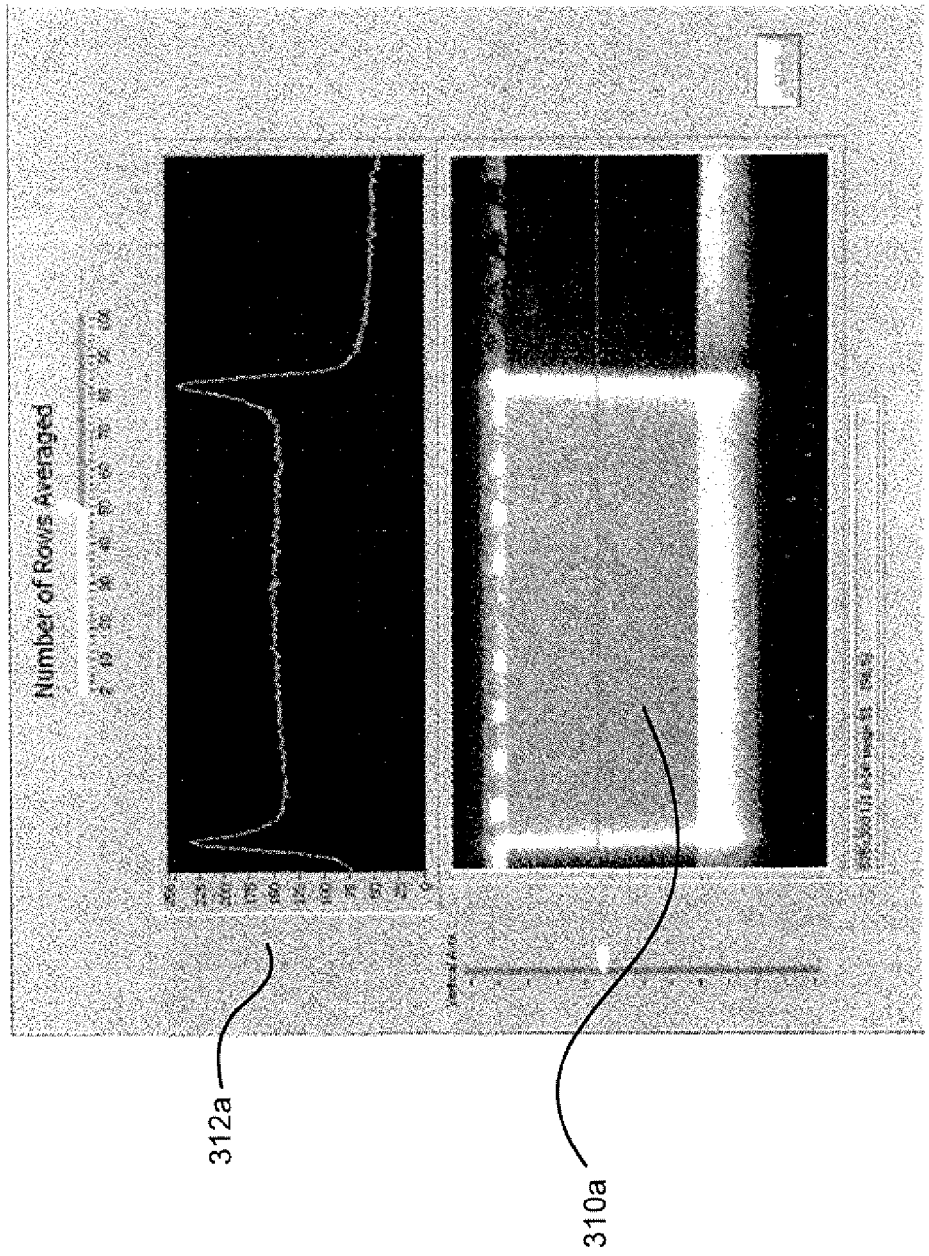
FIG. 3A-3B depict exemplary screenshots of ion beam image in accordance with an embodiment of the present disclosure.
Figure 3B:
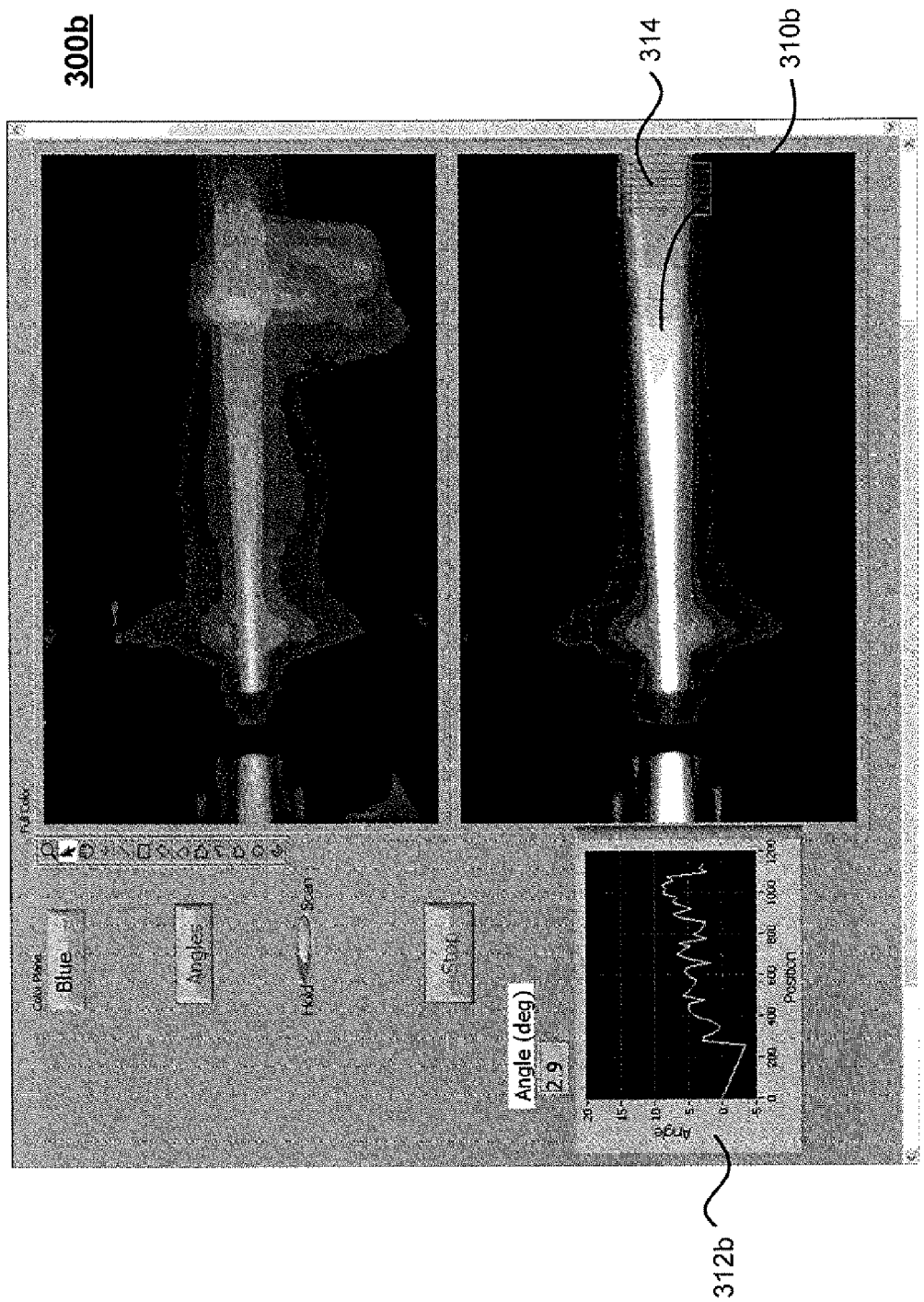

FIGS. 3A-3B depict exemplary screenshots of an ion beam image in accordance with an embodiment of the present disclosure.

Referring to FIG. 3A, a screenshot 300a depicting an ion beam image 310a and a graphical illustration 312a of the ion beam image 310a may be provided. In this example, the ion beam image 310a may indicate that the ion beam 10 does not have a uniform dose profile. For instance, ion beam image 310a depicts an ion beam having greater intensity of light on the edges of the ion beam 10. This greater intensity of light may represent the areas of greater ion dose. As a result, the control system 240 may process this ion beam image 310a (e.g., by averaging the pixel intensity of the ion beam image in rows) and generate the graphical illustration 312a of the dose profile of the ion beam 10. Accordingly, this information may be used by the control system 240 to adjust and fine tune the components of the ion implanter system 200 to provide a uniform dose profile. In one embodiment, the control system 240 may utilize a feedback loop to adjust all the upstream components of the ion implanter system 200 from where the camera 230 is positioned. In this example, the camera 230 may capture multiple ion beam images 310a for the control system to analyze and feedback to these upstream components.

In another embodiment, the control system 240 may utilize a feedforward loop to adjust all the downstream components of the ion implanter system 200 from where the camera 230 is positioned. In this example, the camera 230 and the dose Faraday cup 126 (e.g., dose profiler) may function together to improve dose uniformity. For instance, the dose profiler 126 may feedback to the control system 240 that the ion dose is not uniform. However, the images captured by the camera 230 may indicate that the ion beam 10 where the camera 230 is uniform. As a result, this information may allow the control system 240 to realize that an upstream component, e.g., the corrector magnet 116, which may be situated between the camera 230 and the dose profiler 126, may need to be adjusted for providing ion beam uniformity at the end station 120. Other various embodiments or combinations may also be utilized.

Referring to FIG. 3B, a screenshot 300b depicting an ion beam image 310b and a graphical illustration 312b of beam angles in the ion beam image 310a may be provided. In this example, the ion beam image 310b may be used to measure beam angle and spread 314 of the ion beam 10 at outer edges of the ion beam 10. These image-based measurements may represent the areas of ion beam angles that are not uniform. Accordingly, this information may be used by the control system 240 to adjust and fine tune the components of the ion implanter system 200 to provide a uniform beam angularity. In one embodiment, similar to FIG. 3A, the control system 240 may utilize a feedback loop to adjust all the upstream components of the ion implanter system 200 from where the camera 230 is positioned. In this example, the camera 230 may capture multiple ion beam images 310a for the control system to analyze and feedback to these upstream components. In another embodiment, the control system 240 may utilize a feedforward loop to adjust all the downstream components of the ion implanter system 200 from where the camera 230 is positioned. In this example, similar to FIG. 3A, the camera 230 and the dose Faraday cup 126 (e.g., dose profiler) may function together to improve angle uniformity. Information from the camera 230 and the dose profiler 126 received at the control system 240 may be used to adjust an upstream component, e.g., the corrector magnet 116, which may be situated between the camera 230 and the dose profiler 126, to improve ion angle uniformity at the end station 120. Other various embodiments or combinations may also be utilized.

Figure 4A:
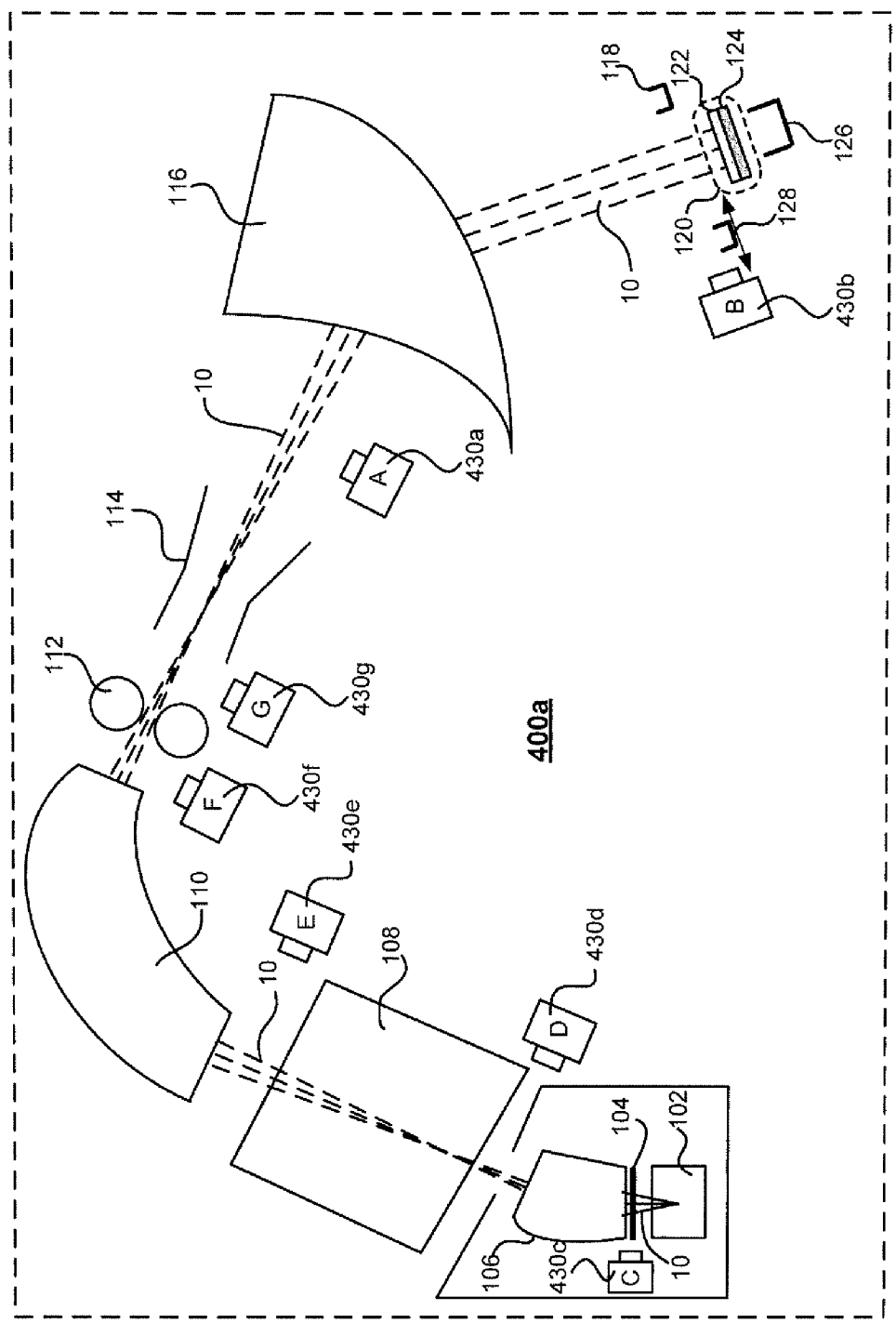
FIG. 4A depicts an exemplary ion implanter system configuration with multiple cameras in accordance with an embodiment of the present disclosure.

It should be appreciated that while only one camera 230 is described with reference to FIGS. 2A-3B, one of ordinary skill in the art would recognize that a greater number of cameras may be implemented. For example, FIG. 4A depicts an exemplary ion implanter system configuration 400a with multiple cameras in accordance with an embodiment of the present disclosure. In this example, a multitude of cameras 430a, 430b, 430c, 430d, 430e 430f, 430g may be situated at various positions, e.g. A-G, within the ion implanter system 400a. In one embodiment, the camera 430b may be situated at position B adjacent to the end station 120. Here, the control system 240 may make adjustments at one or more upstream components of the ion implanter system 400a. Furthermore, imaging the ion beam 10 at position B, where the workpiece 122 may move in and out of the system 200 may provide addition information, such as a wafer charge control, which may be important for additional system calibrations and adjustments. In another embodiment, the camera 430c may be situated at position C adjacent to the extraction manipulator 104. Here, the control system 240 may make adjustments at one or more downstream components of the ion implanter system 400a. In yet another embodiment, cameras 430a, 430d-430g may be situated at positions A and D-G along the ion beam path. Other various embodiments may also be utilized.

It should be appreciated that one of ordinary skill in the art would recognize that one or more cameras may be used simultaneously at any of the various positions depicted in FIG. 4A. Furthermore, it should be appreciated that while cameras 430a, 430b, 430c, 430d, 430e 430f, 430g may be situated at various positions A-G, other various positions within the ion implanter system 400a may also be provided. Additionally, it should be appreciated that cameras 430a, 430b, 430c, 430d, 430e 430f, 430g are not all required to be utilized simultaneously. For example, in one embodiment, a combination of cameras 430a, 430b, and 430d may be utilized to provide image data to the control system 240. Other various combinations and/or embodiments may also be utilized.

Figure 4B:
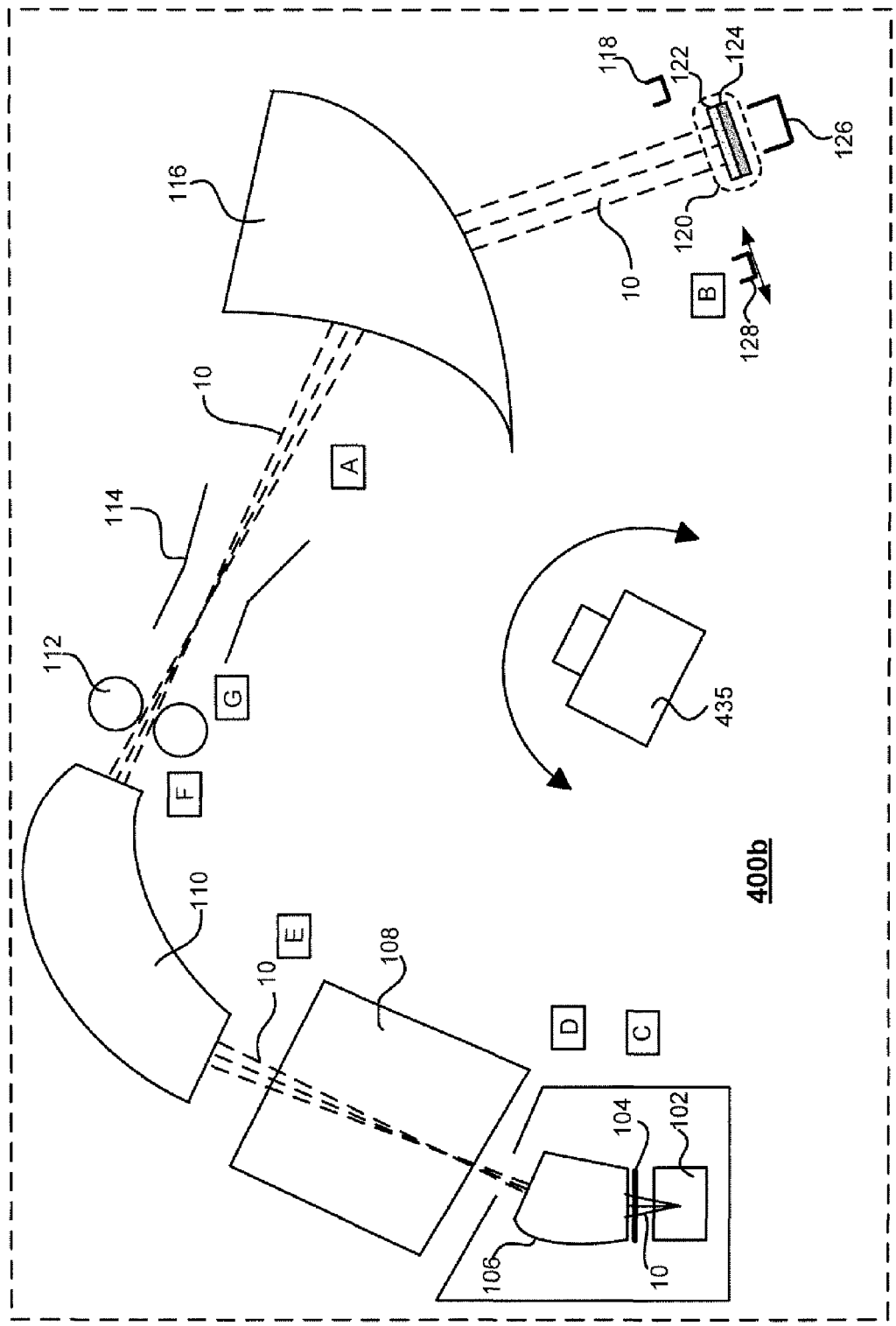
FIG. 4B depicts an exemplary ion implanter system configuration with a swivel camera in accordance with an embodiment of the present disclosure.

FIG. 4B depicts an exemplary ion implanter system configuration 400b with a swivel camera 435 in accordance with an embodiment of the present disclosure. In this example, the swivel camera 435 may be provided at a predetermined position within the ion implanter system 200 that is capable of capturing images at various positions (e.g., positions A-G) along the ion beam path. In one embodiment, swivel camera 435 may capture images of the ion beam 10 from a single or a plurality of positions without having to manipulate the camera 435 at each of the various positions. In one embodiment, the swivel camera 435 may have one window for capturing one or more images from one position at a time. In another embodiment, the swivel camera 435 may have multiple windows for capturing multiple images at different positions along the ion beam path simultaneously. Alternatively, it should be appreciated that a plurality of cameras may be attached to a swivel for capturing multiple images at different positions along the ion beam path simultaneously.

Figure 5A:
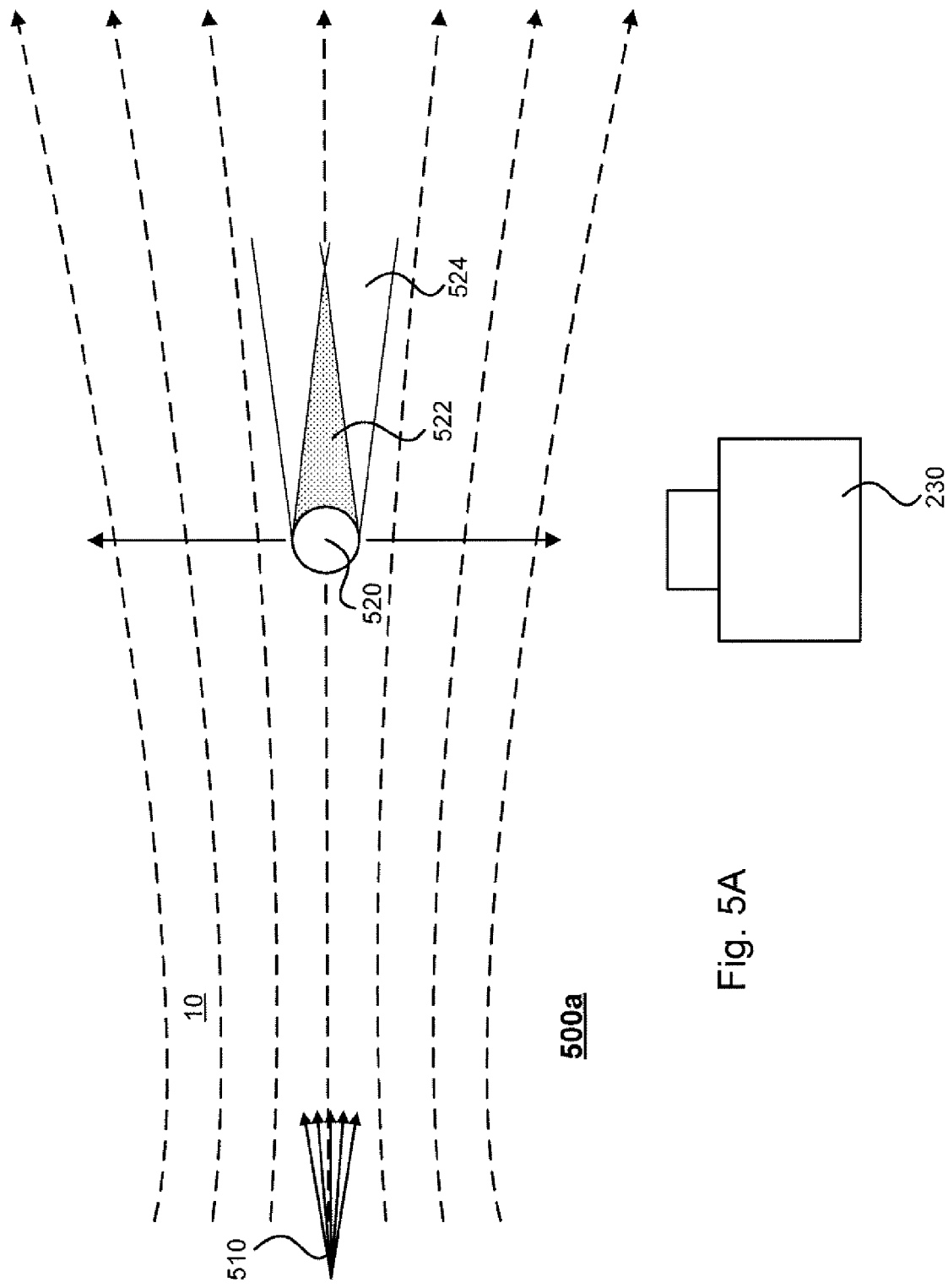
FIG. 5A-5B depict an exemplary ion implanter system configuration with a post in accordance with an embodiment of the present disclosure.
Figure 5B:
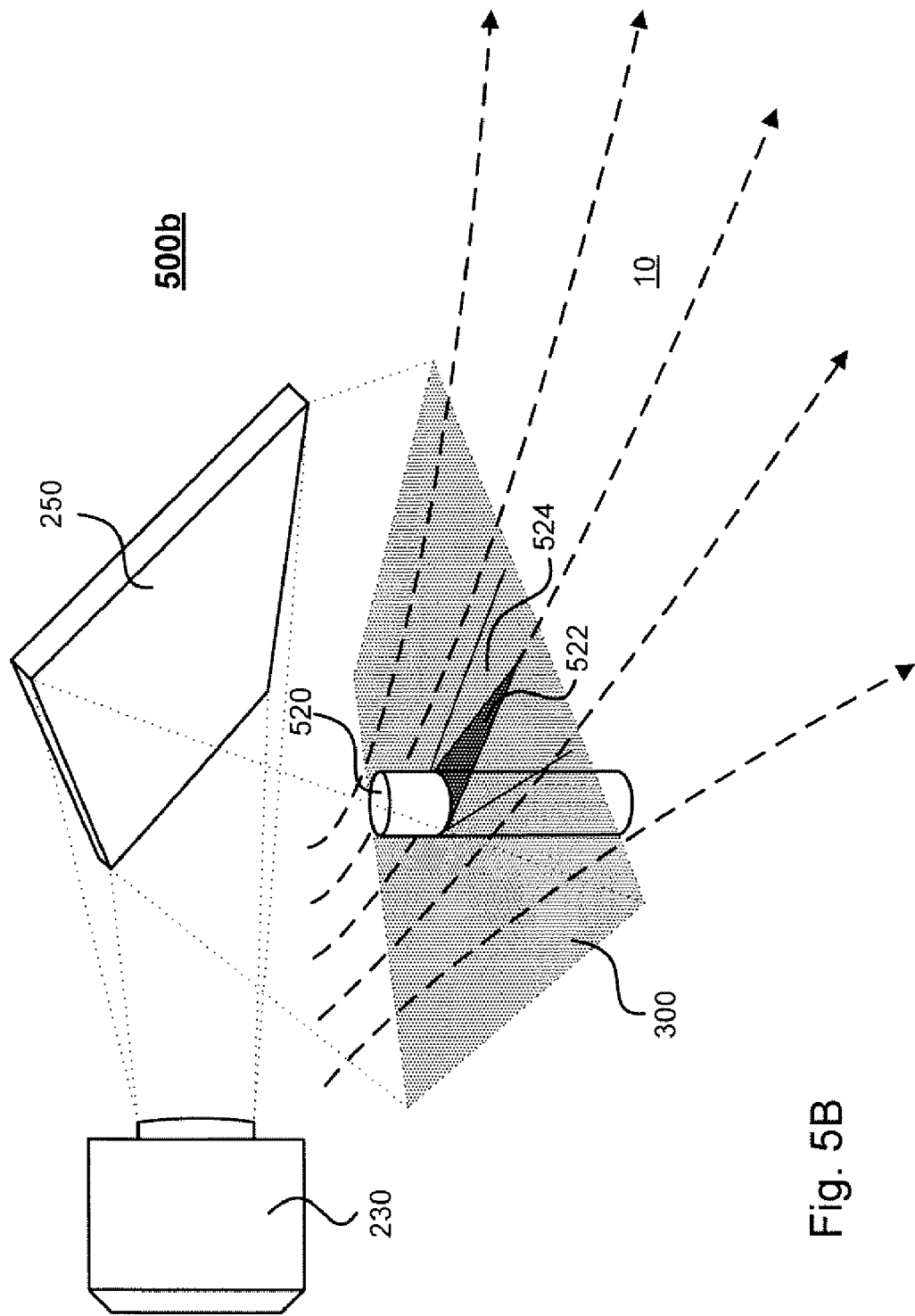

FIGS. 5A-5B depict an exemplary ion implanter system configuration 500a, 500b with a post 520 in accordance with an embodiment of the present disclosure. As discussed above, an ion beam 10 may exhibit an angle spread 510 in addition to an intensity profile. Although a camera 230 may provide an ion beam image that reveals dose and outer angle uniformity, utilizing a post 520 that is orthogonal to the ion beam 10 may provide an additional way to measure angle spread 510, particularly within the interior of the ion beam 10. In this example, the post 520 may cast a shadow including an umbra 522 and penumbra 524. The shadow cast by the post 520 within the ion beam 10 may reveal the angular content at the position where the post 520 is situated. One or more images of the ion beam, including the shadow, may be obtained via the camera 230 for the control system 240 to analyze and ultimately determine the beam angle at the position of the post 520. In one embodiment, the post 520 may be swept in along the ion beam 10, as depicted by arrows of FIG. 5A. In this example, as the post 520 moves along in predetermined increments (e.g., one millimeter), the camera 230 may capture an image of the ion beam and the shadow cast by the post 520 at each predetermined increment. As a result, once the post passes the entire ion beam, a plurality of images of the post 520 and corresponding shadow may be acquired at each of the various increments along the ion beam 10. Accordingly, these images may be used by the control system 240 to provide angle measurements for the interior of the ion beam 10 at each of these various interior positions to determine ion beam emittance and angle uniformity. Furthermore, the current measured at the post 520 may also be used to calibrate ion beam profile.

One advantage of utilizing embodiments of the present disclosure may include the ability to provide immediate image-based feedback (or feedforward) information to various components of the ion implanter system 200 along the ion beam both to improve dose and angle uniformity. In addition, utilizing a camera 230 may provide a non-intrusive way of measuring ion beam profile and angle. This is particularly advantageous because beams that are physically intersected by measuring devices, such as Faraday cups, magnetic shields, or other similar device, prevent simultaneous processing and measurement of the wafer. As a result, implementing image-based control system having one or more cameras at various positions may provide near real-time adjustments of the ion implanter components for enhanced dose and angle uniformity.

Furthermore, since embodiments of the present disclosure generally involves no beam-intersecting parts, little or no maintenance may be required. Therefore, consistency and reliability of ion beam measurements may be achieved with relative regularity. Another advantage of the present disclosure may include an increase in ion beam utilization, which may serve to reduce costs.

In addition to these benefits, embodiments of the present disclosure may provide additional diagnostic implementations. For example, a technique for optical ion beam metrology may also be utilized for ion source tuning and/or ion beam size measurements. Moreover, embodiments of the present disclosure may also be used to determine the location of a beam waist and programmatically move the waist to any desired location, such as, for example, at the center of a resolving aperture. These implementations may be provided by adjusting and fine tuning various beam components, as described above, as well as the voltage and current settings of the ion implanter system 200. Other various implementations may also be provided.

It should be appreciated that while embodiments of the present disclosure utilize the one or more cameras in an environment having a large ion beam 10 in a dark background, other environments may also be provided. For example, the control system 240 may improve signal-to-noise of ion beam images taken in any kind of background. In one embodiment, this may be accomplished by acquiring multiple ion beam images from a camera 230, overlaying and adding these images together, and then averaging them. In another embodiment, background noise and/or unwanted light maybe subtracted by the control system 240. In yet another embodiment, one or more color filters may be utilized to enhance an image of the ion beam 10. For example, by positioning one or more color filters between the camera 230 and the ion beam 10, a colored image of the ion beam 10 may contain additional information about the ions in the beam (e.g., type, density, charge, etc.), which may improve image contrast. Other various imaging enhancements may also be utilized.

Another embodiment of the present disclosure may include depositing one or more gases to the region of the ion beam being imaged. In one embodiment, inserting the one or more gases may increase the light emitted by the ion beam 10, which may improve and enhance an ion beam image. In addition, adding one or more gases may provide additional implementations of the present disclosure. For example, the color of the light may contain additional information about the ions in the beam, such as density, charge, etc. Other various embodiments may also be provided.

It should be appreciated that while embodiments of the present disclosure are directed to providing optical ion beam metrology in ion implantation, other implementations may be provided as well. For example, techniques for providing optical ion beam metrology may apply to plasma-based ion implantation systems, such as glow discharge plasma doping (GD-PLAD) system or radio frequency doping (RF-PLAD) system. Other various systems may also be utilized.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus comprising:
    a post that intersects an ion beam to create a shadow;
    one or more camera systems to capture at least one image of the ion beam including the shadow; and
    a control system coupled to the one or more camera systems to control an angular uniformity of the ion beam in response to the at least one image of the ion beam including the shadow.

2. The apparatus of claim 1, wherein the one or more camera systems comprises one or more moveable minors.

3. The apparatus of claim 1, wherein the one or more camera systems are positioned at various positions along an ion beam path.

4. The apparatus of claim 1, wherein the one or more camera systems comprise at least one swivel camera.

5. The apparatus of claim 1, wherein the control system further comprises a dose profiler to provide information to one or more ion implantation components in at least one of a feedback loop and a feedforward loop.

6. The apparatus of claim 1, wherein the one or more camera systems comprises at least one color filter to enhance the image of the ion beam.

7. The apparatus of claim 6, wherein the enhanced image of the ion beam provides at least one of the following additional information about ions in the beam: type, density, and charge.

8. The apparatus of claim 1, further comprising one or more gases to enhance the image of the ion beam.

9. A method comprising:
   driving a post to intersect an ion beam to create a shadow;
   capturing at least one image of the ion beam including the shadow with one or more camera systems; and
   coupling a control system to the one or more camera systems to control an angular uniformity of the ion beam based on the at least one image of the ion beam including the shadow.

10. The method of claim 9, wherein the one or more camera systems comprises one or more moveable mirrors.

11. The method of claim 9, wherein the one or more camera systems are positioned at various positions along an ion beam path.

12. The method of claim 9, wherein the one or more camera systems comprise at least one swivel camera.

13. The method of claim 9, wherein the control system further comprises a dose profiler to provide information to one or more ion implantation components in at least one of a feedback loop and a feedforward loop.

14. The method of claim 9, wherein the one or more camera systems comprises at least one color filter to enhance the image of the ion beam.

15. The method of claim 14, wherein the enhanced image of the ion beam provides at least one of the following additional information about ions in the beam: type, density, and charge.

16. The method of claim 9, further comprising inserting one or more gases to enhance the image of the ion beam.

17. A downloadable, computer-readable media comprising code to perform the acts of the method of claim 9.

* * * * *